United States Patent [19]

Franke et al.

[11] Patent Number: 4,812,384

[45] Date of Patent: Mar. 14, 1989

[54] LIGHT-SENSITIVE POLYCONDENSATION PRODUCT CONTAINING DIAZONIUM GROUPS, PROCESS FOR THE PREPARATION THEREOF, AND LIGHT-SENSITIVE RECORDING MATERIAL CONTAINING THIS POLYCONDENSATION PRODUCT

[75] Inventors: Werner Franke, Wiesbaden; Richard Brahm, Ingelheim, both of Fed. Rep. of Germany

[73] Assignee: Hoechst Aktiengesellschaft, Fed. Rep. of Germany

[21] Appl. No.: 934,026

[22] Filed: Nov. 24, 1986

[30] Foreign Application Priority Data

Nov. 26, 1985 [DE] Fed. Rep. of Germany ....... 3541723

[51] Int. Cl.$^4$ .................... G03C 1/54; C07C 113/04
[52] U.S. Cl. .................... 430/175; 430/163; 534/559; 534/564
[58] Field of Search ............. 430/175, 163; 534/559, 534/564

[56] References Cited

U.S. PATENT DOCUMENTS

| | | | |
|---|---|---|---|
| 3,219,447 | 11/1965 | Neugebauer et al. | 430/163 |
| 3,220,832 | 11/1965 | Uhlig | 430/175 |
| 3,235,384 | 2/1966 | Neugebauer et al. | 96/33 |
| 3,269,837 | 8/1966 | Sus | 430/163 |
| 3,849,392 | 11/1974 | Steppan | 260/141 |
| 4,387,151 | 6/1983 | Bosse et al. | 430/175 |

FOREIGN PATENT DOCUMENTS 1172492  8/1984  Canada .
1359522  7/1974  United Kingdom .

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A diazonium salt polycondensation product which comprises units of
(a) a diazonium salt represented by the formula

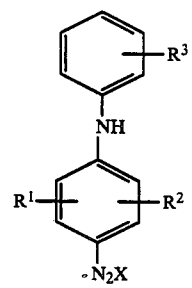

(I)

in which
R$^1$, R$^2$ and R$^3$ are hydrogen atoms, halogen atoms, alkyl groups or alkoxy groups and
X is the anion of an aminoalkanesulfonic acid, and
(b) a compound represented by the formula $$R^4\text{—O—CH}_2\text{—}R^6\text{—CH}_2\text{—O—}R^5 \quad \text{(II)}$$

in which
R$^4$ and R$^5$ are hydrogen atoms, alkyl groups or aliphatic acyl radicals and
R$^6$ is the radical of an aromatic hydrocarbon, a phenol, a phenol ether, an aromatic thioether, an aromatic heterocyclic compound or an organic acid amide, and which is suitable as a light-sensitive substance for the preparation of planographic printing plates that can be developed with pure water.

3 Claims, No Drawings

LIGHT-SENSITIVE POLYCONDENSATION PRODUCT CONTAINING DIAZONIUM GROUPS, PROCESS FOR THE PREPARATION THEREOF, AND LIGHT-SENSITIVE RECORDING MATERIAL CONTAINING THIS POLYCONDENSATION PRODUCT

BACKGROUND OF THE INVENTION

The present invention relates to novel, light-sensitive polycondensation products of aromatic diazonium salts, which products are suitable for the preparation of light-sensitive recording materials, particularly planographic printing plates, that can be developed with water.

It is known to prepare polycondensation products by reacting an aromatic diazonium salt, especially a diphenylamine-4-diazonium salt, with a second component carrying active methylol groups or esters or ethers thereof, the reactive groups being introduced in the simplest case by reacting the second component with formaldehyde. These condensation products give high-grade, radiation-sensitive materials, particularly printing plates, and are widely utilized industrially. They are described in U.S. Pat. No. 3,849,392.

All printing plates used in industry that are based on these condensation products are developed with solutions that are predominantly aqueous. But these solutions always require quite considerable quantities of other additives, such as alkaline or acidic buffer salts, water-miscible organic solvents and wetting agents. Such additives become necessary in particular if the light-sensitive layer also contains polymeric binders in addition to the diazonium salt polycondensation products. Plates of this type are described, for example, in European Patent Application No. 48,876 and 71,881.

For reasons of easy processability and, in particular, for reducing pollution of the environment, the ability to develop planographic printing plates solely with water would be desirable.

Although it is known from German Auslegeschrift No. 1,214,086 that negative-working planographic printing plates based on diphenylamine4-diazonium salt/formaldehyde condensation products can be obtained by developing with pure water, these plates give only a relatively short print run and have a relatively low light sensitivity. Moreover, the ink acceptance of these printing forms is inadequate in most cases, so that additional treatment of the developed plate with an oleophilic coating is necessary.

Finally, German Offenlegungsschrift No. 2,041,395 has disclosed a light-sensitive mixture for the preparation of screen printing forms, which mixture contains a water-soluble diazonium salt cocondensation product of the type described above, which is present as the salt of a lower aliphatic monosulfonic acid. These condensation products have a higher light sensitivity than the abovementioned formaldehyde condensation products. They are always used in combination with a hydrophilic polymer, but have been described exclusively with reference to the preparation of screen printing stencils and can be developed with pure water. This patent publication does not mention also using the condensation products for planographic printing; the disclosed mixtures would, in fact, be unsuitable for this purpose because of their high hydrophilic binder content.

It has also been found that these diazonium salt condensation products tend, in precipitation with methanesulfonic acid or salts thereof, to carry down a relatively large quantity of impurities. The precipitation products must therefore be laboriously purified if products of reproducible composition and activity are to be obtained. Other condensation products of this type must, after precipitation, be stirred for a prolonged period at an elevated temperature, until they have been converted into a form which can be filtered.

SUMMARY OF THE INVENTION

It is therefore an object of the present invention to provide a light sensitive diazonium salt condensation product that is suitable for the preparation of planographic printing plates which are characterized by high light sensitivity and long print runs, and which can be developed after exposure with pure water.

It is also an object of the present invention to provide a process for producing a diazonium salt polycondensation product having the above-mentioned characteristics which does not require laborious purification of the condensation products to achieve consistent results.

In accomplishing the foregoing objects, there has been provided, in accordance with one aspect of the present invention, a light-sensitive polycondensation product which contains diazonium groups, comprising units of (a) a diazonium salt represented by the formula

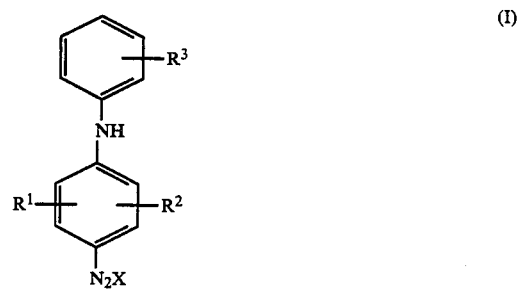

in which
R[1], R[2] and R[3] separately denote a hydrogen atom, a halogen atom, an alkyl group having 1 to 3 carbon atoms or an alkoxy group having 1 to 6 carbon atoms and
X denotes the anion of the diazonium salt, and (b) a compound represented by the formula

in which
R[4] and R[5] separately denote a hydrogen atom, an alkyl group or an aliphatic acyl radical and
R[6] denotes a radical of an aromatic hydrocarbon, a phenol, a phenol ether, an aromatic thioether, an aromatic heterocyclic compound or an organic acid amide,
wherein the diazonium salt anion of the polycondensation product is the anion of an aminoalkanesulfonic acid.

In accordance with another aspect of the present invention, a process for the preparation of aforesaid polycondensation product is provided, comprising the steps of (a) condensing a diazonium salt represented by the formula

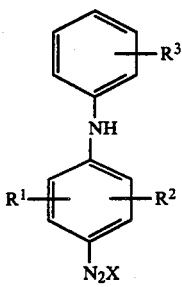

(I)

in which
R¹, R² and R³ separately denote a hydrogen atom, a halogen atom, an alkyl group having 1 to 3 carbon atoms or an alkoxy group having 1 to 6 carbon atoms and
X denotes the anion of the diazonium salt,
in a strongly acidic medium with a compound represented by the formula $$R^4-O-CH_2-R^6-CH_2O-R^5 \qquad (II)$$

in which
R⁴ and R⁵ separately denote a hydrogen atom, an alkyl group or an aliphatic acyl radical and
R⁶ denotes the radical of an aromatic hydrocarbon, a phenol, a phenol ether, an aromatic thioether, an aromatic heterocyclic compound or an organic acid amide; and (b) isolating the resulting condensation product as an aminoalkanesulfonate by adding an excess of an aminoalkanesulfonic acid or an alkali metal salt thereof.

In accordance with still another aspect of the present invention, a light-sensitive recording material is provided which is comprised of a layer carrier and a light-sensitive layer provided thereon which contains the above-described diazonium salt polycondensation product as a light-sensitive compound.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The process of the present invention comprises isolating the above-mentioned condensation product as an aminoalkanesulfonate by adding an excess of an aminoalkanesulfonic acid or an alkali metal salt thereof. The diazonium salt of a condensation product according to the present invention thus has an anion that is the anion of an aminoalkanesulfonic acid. The invention further provides a light-sensitive recording material comprised of a layer carrier and a light-sensitive layer that contains, as the light-sensitive compound, a diazonium salt polycondensation product as previously described.

The condensation products of the oresent invention are prepared by first condensing, in a manner known from the art, a diazonium salt represented by formula I with a formula II compound in a strongly acidic medium, for example in sulfuric acid, phosphoric acid or methanesulfonic acid. This reaction is described in detail in U.S. Pat. No. 3,849,392. The condensation product is isolated from the reaction mixture in a conventional manner, for example, as the chloride, or is further processed as the crude product. The desired salt can be precipitated from the solution of the chloride in water or from the reaction mixture by adding a concentrated aqueous solution of the appropriate aminoalkanesulfonic acid (or an alkali metal salt thereof). Surprisingly, this gives the aminoalkanesulfonate of the condensation product in a form that is already very pure; for most applications, purification is therefore no longer needed.

The precipitation can be carried out, for example, in such a way that a concentrated aqueous solution of the desired sulfonic acid is added in an excess of at least about 10% to an aqueous solution of the chloride of the diazonium salt polycondensation product, and the mixture is then stirred for some time—about 3 minutes—typically at 20° C. The product is then caused to precipitate by salting out with sodium chloride, and is stirred for about anoter 20 to 30 minutes until a precipitate is formed which can readily be filtered off by suction and which no longer sticks together, even on drying. The precipitate is then filtered off with suction, washed with saturated sodium chloride solution, and dried in vacuo at about 40° C.

Aminoalkanesulfonic acids which are suitable for use according to the present invention include those having 2 to 12, in particular 4 to 10, carbon atoms. The amino groups can be primary, secondary or tertiary, especially secondary or tertiary. The aminoalkanesulfonic acids can contain, for example, hydroxyl or alkoxy groups, or halogen atoms as additional substituents. The alkane groups can be unsaturated but are preferably saturated, and can be straight-chain, branched or cyclized. The amino groups can be arranged within the chain of the aminoalkane groups or as side substituents or terminal substituents. An amino group can also be a constituent of a preferably saturated heterocyclic ring.

Among the suitable diazonium salt polycondensation products are co-condensation products of aromatic diazonium salts, such as diphenylamine-4-diazonium salts, that are capable of condensation and that comprise, in addition to the diazonium salt units, non-photosensitive units which are derived from compounds capable of condensation; the latter group particularly includes aromatic amines, phenols, thiophenols, phenol ethers, aromatic thioethers, aromatic hydrocarbons, aromatic heterocyclic compounds and organic acid amides. These condensation products are described in German Offenlegungsschrift No. 2,024,244.

The diazonium salt units are preferably derived from compounds represented by the formula $(R^1-R^3-)_p$-$R^2-N_2X$, in which
X is the anion of the diazonium compound,
p is an integer from 1 to 3,
R¹ is an aromatic radical with at least one position capable of condensation with an active carbonyl compound,
R2 is a phenylene group,
R3 is a single bond or one of the following groups:
—(CH₂)$_q$—NR⁴—,
—O—(CH₂)$_r$—NR⁴—,
—S—(CH₂)$_r$—NR⁴—,
—S—CH₂CO—NR⁴—, —O—R⁵—O—,
—O—
—S— or
—CO—NR⁴— where
q is a number from 0 to 5,
r is a number from 2 to 5,
R⁴ is hydrogen, an alkyl group having 1 to 5 carbon atoms, an aralkyl group having 7 to 12 carbon atoms or an aryl group having 6 to 12 carbon atoms, and
R⁵ is an arylene group having 6 to 12 carbon atoms.

The diazonium salt polycondensation products of the present invention can be used for various reprographic purposes, for example, in the preparation of printing plates, screen printing forms, photoresists and color proofing films. They are particularly suitable for the preparation of light-sensitive planographic printing plates. For this purpose, a preferably aqueous solution of the condensation product is applied to a layer carrier suitable for planographic printing, and is then dried.

In addition to the above-described condensation products, the coating solutions can contain conventional additives, such as dyes, pigments, plasticizers, wetting agents, levelling agents, color indicators, photolysable acid donors and binders, particularly water-soluble binders. Light-sensitive layers prepared according to the present invention are preferably free of binders.

The present invention enables copying materials for the preparation of planographic printing forms to be made by coating suitable layer supports with purely aqueous coating solutions. The exposed copying materials can be developed with pure water, that is, with water substantially lacking in additives like organic solvents, alkalis and salts. The light sensitivity of copying materials within the present invention is very high.

For preparing the light-sensitive copying material of the present invention, the light-sensitive component is dissolved in water. The solution thus obtained is applied to a layer carrier suitable for planographic printing, and then is dried. The coating can be effected by whirler-coating, by spraying, by dipping, by roller application or by means of a liquid film, and also depends on the properties of the material to be coated. The coating solution should have a concentration in the range from about 0.5 to 10.0% by weight, preferably from 1.0 to 4.0% by weight. The layer applied should (after drying) amount to about 0.3 g/m². The right concentration in a given case must be determined by simple tests. The drying temperature is generally between 45° C. and the decomposition temperature of the diazonium compound. The precise temperature depends on the nature of the drying process and the duration of drying.

Suitable layer carriers can be comprised of a most diverse range of materials, such as paper, zinc, magnesium, aluminum, chromium, copper, brass, steel and multi-metal foils and plastic films. For the preparation of planographic printing plates, mechanically, chemically or electrolytically grained aluminum is preferably used; prior to coating, the grained aluminum can be advantageously pretreated with silicates or phosphonic acids, in particular polyvinylphosphonic acid, in the known manner.

The exposure of the copying material is carried out in conventional fashion, under an original with sources of copying light which emit the highest possible spectral fraction in the near-ultraviolet region. It can also be carried out by laser irradiation. Relatively short-wave lasers of appropriate power, for example, Ar lasers, krypton ion lasers and helium/cadmium lasers, which emit approximately between 300 and 600 nm, are suitable for irradiation purposes.

The processing of the copying materials up to a form ready for printing is effected in the conventional manner. Laser irradiation or exposure under an original is carried out. Whereas the layer is hardened and becomes largely insoluble in the areas struck by light, the unexposed parts of the layer, which remain soluble, are washed out or removed via dipping and/or contactless spraying with water from a sprinkler head. After development, the planographic printing form prepared in this way is, if appropriate, inked with oily ink and provided with a preservative, such as gum arabic.

Pure water, for example, tap water, is preferred as the developer. However, small quantities of organic solvents, wetting agents, salts, acids and the like can also be added.

The following examples illustrate preferred embodiments of the present invention.

EXAMPLE 1

A 3% aqueous solution of the condensation product obtained from 1 mol of 3-methoxy-diphenylamine-4-diazonium salt and 1 mol of 4,4'-bis-methoxymethyl-diphenyl ether, isolated as the salt of 2-(4-hydroxyethyl-piperazino)-ethanesulfonic acid, was applied by whirler-coating to an aluminum plate which had been electrolytically grained, anodically oxidized and pretreated with polyvinylphosphonic acid, and was dried. The dry layer had a weight of 0.3 g/m². This gave a highly light-sensitive printing plate which, after imagewise exposure, could be developed without any problems by simple spraying with tap water from a sprinkler head.

EXAMPLE 2

A 3% aqueous solution of a condensation product as in Example 1, but isolated as the salt of 3-cyclohexylaminopropanesulfonic acid, was applied by spin-coating to mechanically grained aluminum which had been pretreated with polyvinylphosphonic acid. After imagewise exposure, it was possible to develop the plate with water.

EXAMPLE 3

A 3% aqueous solution of a condensation product as in Example 1, but isolated as the salt of 3-(tris-hydroxymethylmethylamino)-2-hydroxypropanesulfonic acid, was applied to drybrushed aluminum (pretreated with polyvinylphosphonic acid) and dried. The resulting plates had a layer thickness of 0.4 g/m², showed excellent light sensitivity, and could be developed with water after imagewise exposure.

What is claimed is:
1. A light-sensitive polycondensation product which contains diazonium groups, comprising units of
(a) a diazonium salt represented by the formula

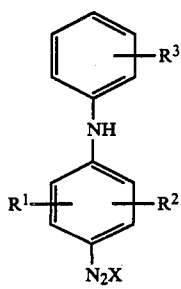

(I)

in which
R¹, R² and R³ separately denote a hydrogen atom, a halogen atom, an alkyl group having 1 to 3 carbon atoms or an alkoxy group having 1 to 6 carbon atoms and
X denotes then anion of said diazonium salt, and
(b) A compund represented by the formula $$R^4-O-CH_2-R^6-CH_2-O-R^5 \qquad (II)$$

in which
R⁴ and R⁵ separately denote a hydrogen atom, an alkyl group or an aliphatic acyl radical and
R⁶ denotes a radical of an aromatic hydrocarbon, a phenol, a phenol ether, aromatic thioether, an aromatic heterocyclic compound or an organic acid amide,
wherein the diazonium salt anion of said polycondensation product is the anion of an aminoalknesulfonic acid or an alkali metal salt thereof that is soluble in purely aqueous solution and is capable of forming, after irradiation, a water-insoluble product.

2. A polycondensation product as claimed in claim 1, wherein said aminoalkanesulfonic acid is substituted by a hydroxyl or an alkoxy group.

3. A light-sensitive recording material comprised of a layer carrier and a light-sensitive layer provided on said layer carrier, wherein said light-sensitive layer comprises diazonium salt poloycondensation product as claimed in claim 1, and is capable of forming, after irradiation and developement by water, a negative image in radiation-exposed areas of said light-sensitive layer.

* * * * *

UNITED STATES PATENT AND TRADEMARK OFFICE
CERTIFICATE OF CORRECTION

PATENT NO. : 4,812,384
DATED      : March 14, 1989
INVENTOR(S) : Werner FRANKE et al.

It is certified that error appears in the above-identified patent and that said Letters Patent is hereby corrected as shown below:

Claim 1, column 7, line 21, correct the spelling of "compound";

Claim 1, column 8, line 9, correct the spelling of

"aminoalkanesulfonic".

Claim 3, column 8, line 19, insert before "diazonium" an --a--;

and correct the spelling of "polycondensation".

Signed and Sealed this

Second Day of January, 1990

Attest:

JEFFREY M. SAMUELS

Attesting Officer     Acting Commissioner of Patents and Trademarks